(12) United States Patent
Hopkins et al.

(10) Patent No.: US 12,432,925 B2
(45) Date of Patent: Sep. 30, 2025

(54) INTEGRATED ASSEMBLIES WHICH INCLUDE STACKED MEMORY DECKS, AND METHODS OF FORMING INTEGRATED ASSEMBLIES

(71) Applicant: Lodestar Licensing Group LLC, Evanston, IL (US)

(72) Inventors: John D. Hopkins, Meridian, ID (US); Justin B. Dorhout, Boise, ID (US); Nirup Bandaru, Boise, ID (US); Damir Fazil, Boise, ID (US); Nancy M. Lomeli, Boise, ID (US); Jivaan Kishore Jhothiraman, Meridian, ID (US); Purnima Narayanan, Boise, ID (US)

(73) Assignee: Lodestar Licensing Group LLC, Evanston, IL (US)

( * ) Notice: Subject to any disclaimer, the term of this patent is extended or adjusted under 35 U.S.C. 154(b) by 0 days.

(21) Appl. No.: 18/735,864

(22) Filed: Jun. 6, 2024

(65) Prior Publication Data
US 2024/0397717 A1    Nov. 28, 2024

Related U.S. Application Data

(60) Continuation of application No. 18/218,762, filed on Jul. 6, 2023, now Pat. No. 12,010,850, which is a
(Continued)

(51) Int. Cl.
*H10B 43/27* (2023.01)
*H10B 41/10* (2023.01)
*H10B 41/27* (2023.01)
*H10B 41/35* (2023.01)
*H10B 43/10* (2023.01)
*H10B 43/35* (2023.01)

(52) U.S. Cl.
CPC ............ *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 41/10; H10B 41/27; H10B 41/35; H10B 43/10; H10B 43/27; H10B 43/35; G11C 16/08
USPC ........................................................ 257/330
See application file for complete search history.

(56) References Cited

U.S. PATENT DOCUMENTS 9,966,384 B2    5/2018  Lee
2019/0006381 A1  1/2019  Nakatsuji
(Continued)

*Primary Examiner* — Hoai V Pham
(74) *Attorney, Agent, or Firm* — TraskBritt

(57) ABSTRACT

Some embodiments include an integrated assembly having a first deck which has first memory cells, and having a second deck which has second memory cells. The first memory cells have first control gate regions which include a first conductive material vertically between horizontally-extending bars of a second conductive material. The second memory cells have second control gate regions which include a fourth conductive material along an outer surface of a third conductive material. A pillar passes through the first and second decks. The pillar includes a dielectric-barrier material laterally surrounding a channel material. The first and fourth materials are directly against the dielectric-barrier material. Some embodiments include methods of forming integrated assemblies.

20 Claims, 20 Drawing Sheets

Related U.S. Application Data continuation of application No. 17/391,453, filed on Aug. 2, 2021, now Pat. No. 11,744,072, which is a division of application No. 16/700,877, filed on Dec. 2, 2019, now Pat. No. 11,107,831.

(56) References Cited

U.S. PATENT DOCUMENTS

| | | |
|---|---|---|
| 2019/0013404 A1* | 1/2019 | Carlson ............ H01L 21/02252 |
| 2021/0020650 A1 | 1/2021 | Yang |
| 2021/0143085 A1 | 5/2021 | Cheng |
| 2021/0159149 A1 | 5/2021 | Kitazawa |

* cited by examiner

INTEGRATED ASSEMBLIES WHICH INCLUDE STACKED MEMORY DECKS, AND METHODS OF FORMING INTEGRATED ASSEMBLIES

PRIORITY INFORMATION

This application is a continuation of U.S. application Ser. No. 18/218,762, filed Jul. 6, 2023, now U.S. Pat. No. 12,010,850, issued on Jun. 11, 2024, which is a continuation of U.S. application Ser. No. 17/391,453, filed Aug. 2, 2021, which issued as U.S. Pat. No. 11,744,072 on Aug. 29, 2023, which is a divisional of U.S. application Ser. No. 16/700,877, filed Dec. 2, 2019, which issued as U.S. Pat. No. 11,107,831 on Aug. 31, 2021, the contents of which are hereby incorporated herein by reference.

TECHNICAL FIELD

Integrated assemblies which include stacked memory decks, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid-state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations which are to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The NAND memory device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_1$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The NAND memory array 200 includes wordlines $202_1$ to $202_N$, and bitlines $228_1$ to $228_M$.

The NAND memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and NAND strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a NAND string 206 and a source-select line 214, while each drain-select device 212 is located at an intersection of a NAND string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

Memory may be fabricated in decks, and two or more decks may be stacked one atop another. Channel regions of each of the decks may comprise channel-material pillars, and it may be desired to couple channel-material pillars of the stacked decks. It would be desirable to develop improved methods of fabricating stacked memory decks, and specifically to develop improved methods of coupling channel-material pillars of stacked memory decks.

DETAILED DESCRIPTION OF THE ILLUSTRATED EMBODIMENTS

Some embodiments include methods of using some regions of a continuous conductive material of a lower deck as wordlines (routing structures) of a memory device, and using other regions of the continuous conductive material of the lower deck as sacrificial material which is removed to form openings through the lower deck. One or more memory cell materials (e.g., channel material, charge-storage material, etc.) may be formed within the opening during fabrication of memory cells of the memory device. An upper deck may be formed over the lower deck to form a multi-deck memory device. The openings formed through the lower deck may extend from openings formed through the upper deck. An inter-deck material may be provided between the upper and lower decks. The inter-deck material may be "soft", and specifically may be relatively easy to etch as compared to other materials of the upper and lower decks. Some embodiments include integrated assemblies (e.g., multi-deck memory devices) formed utilizing the methodology described above. Example embodiments are described with reference to FIGS. 5-18.

Figure 1:
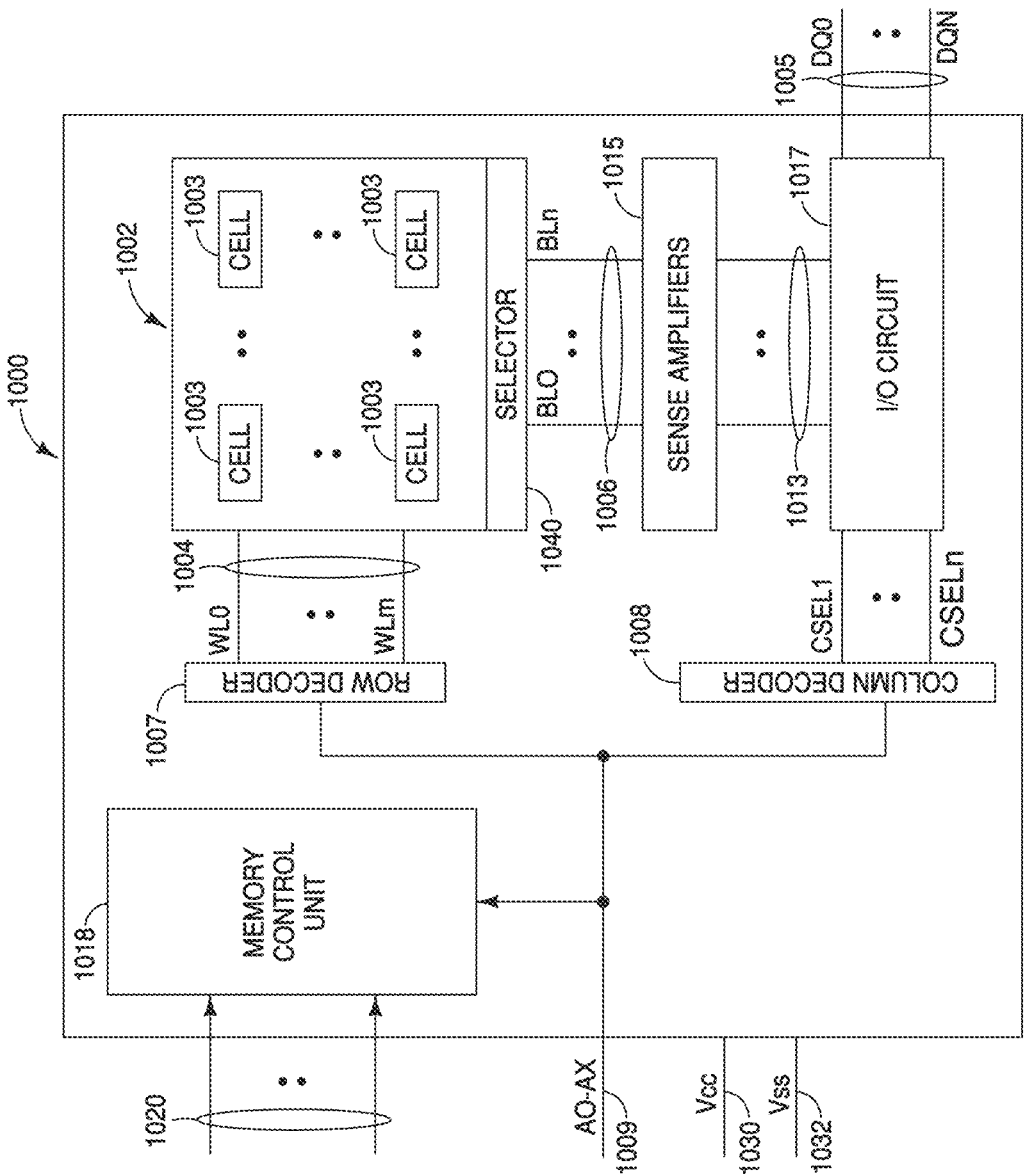
FIG. 1 shows a block diagram of a prior art memory device having a memory array with memory cells.
Figure 2:
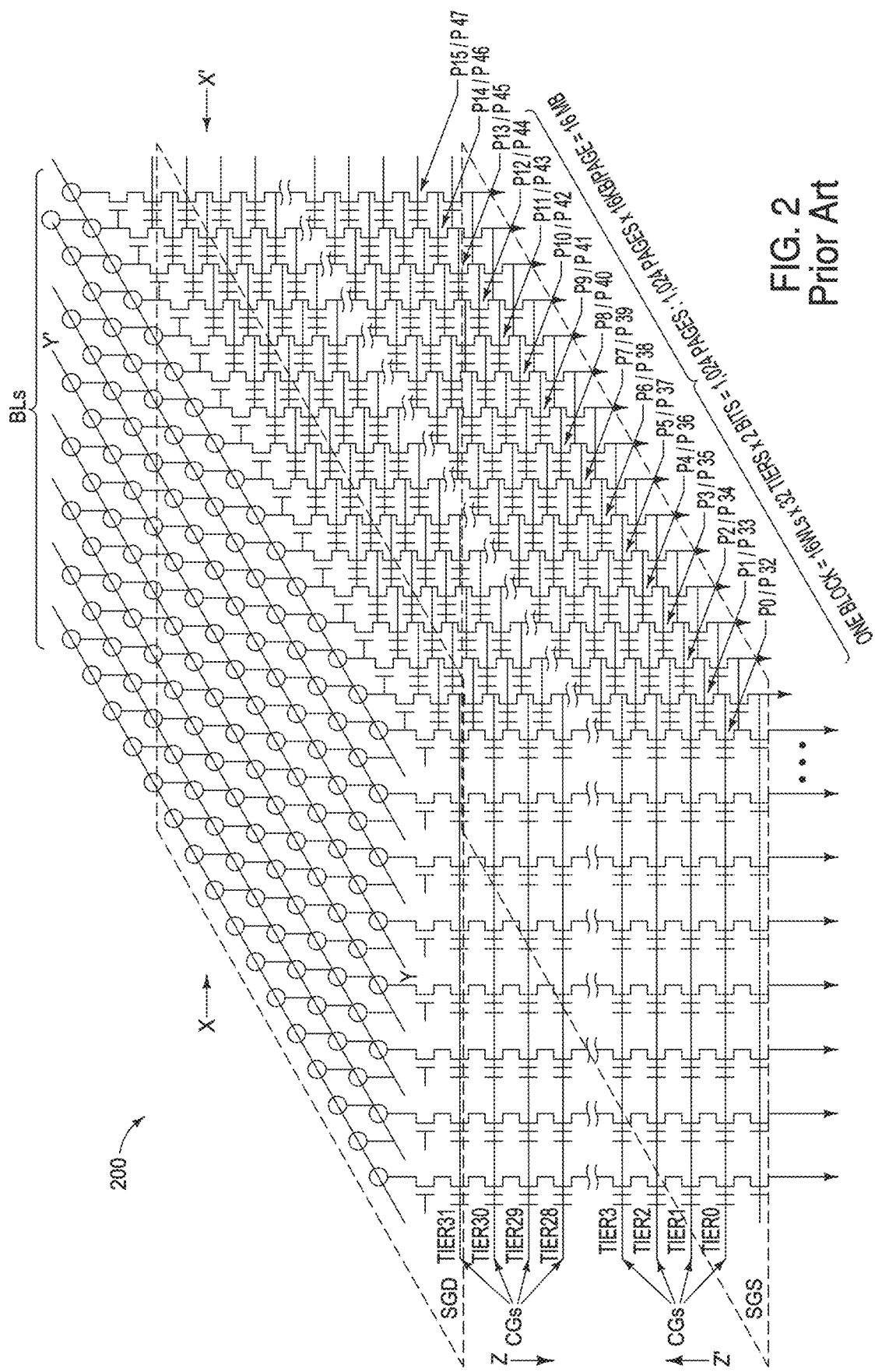
FIG. 2 shows a schematic diagram of the prior art memory array of FIG. 1 in the form of a 3D NAND memory device.
Figure 3:
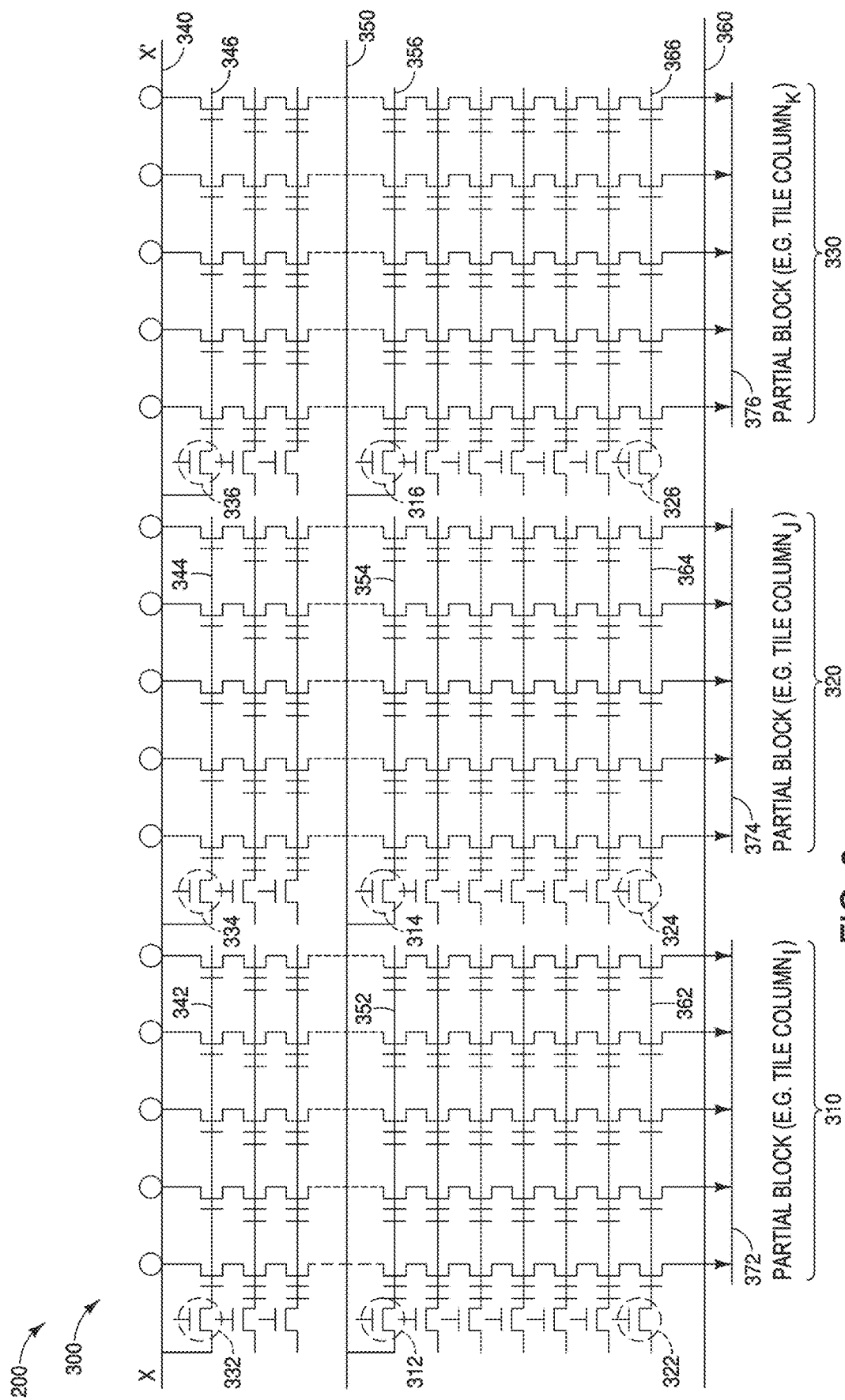
FIG. 3 shows a cross-sectional view of the prior art 3D NAND memory device of FIG. 2 in an X-X' direction.
Figure 4:
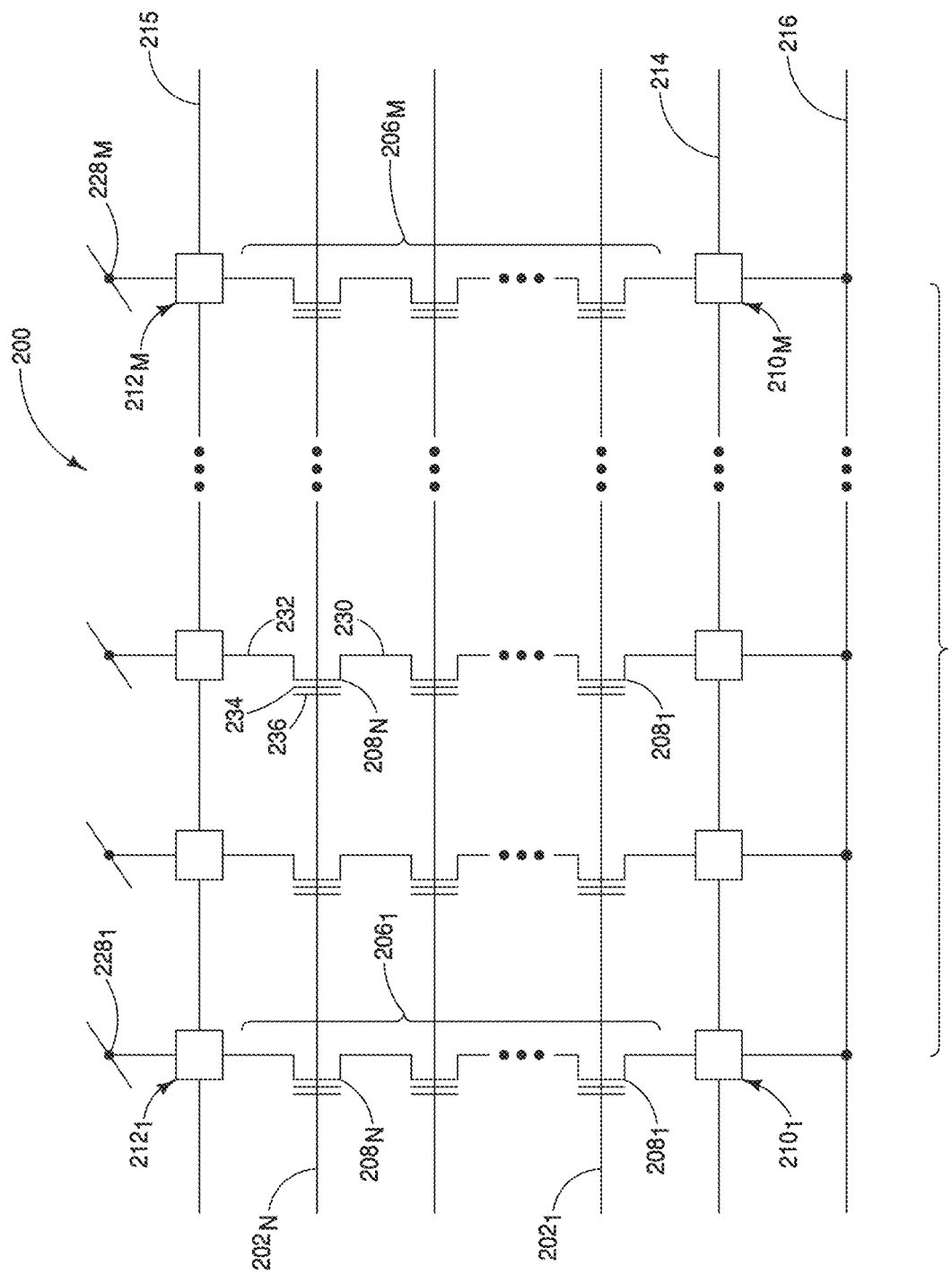
FIG. 4 is a schematic diagram of a prior art NAND memory array.
Figure 5:
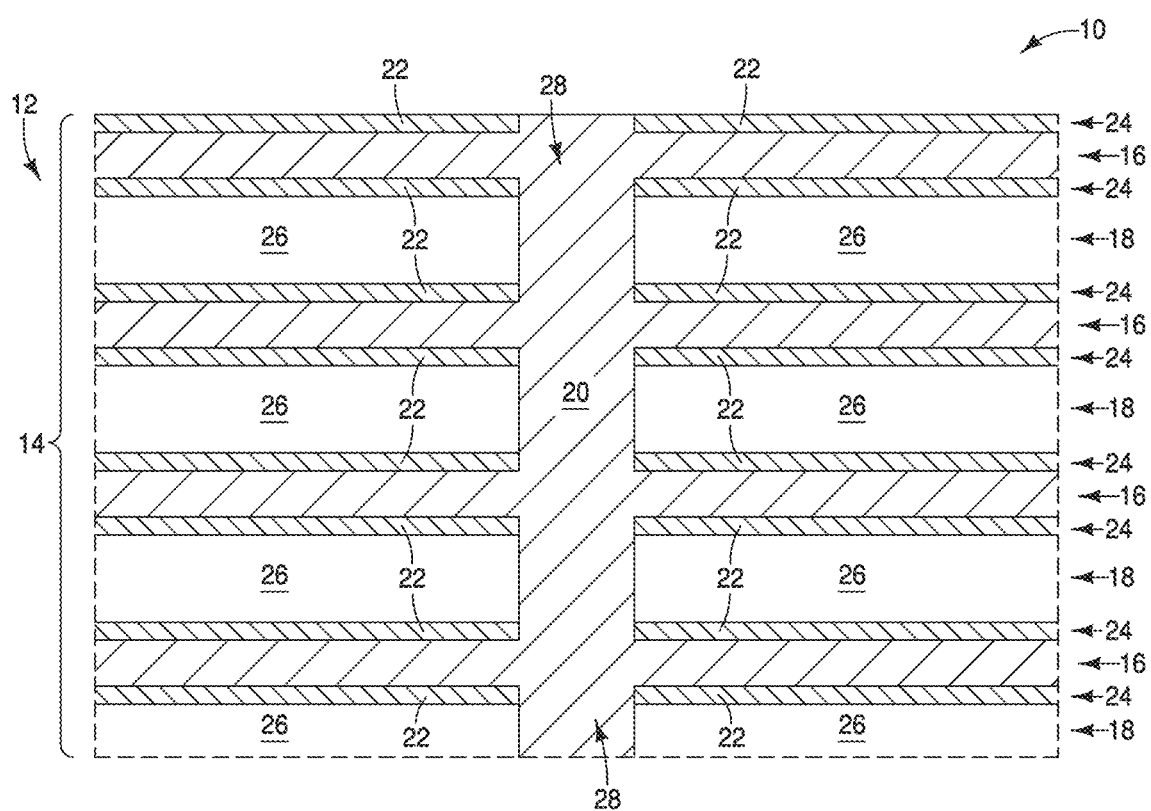
FIGS. 5-8 are diagrammatic cross-sectional side views of a region of an integrated assembly at example process stages of an example method for forming an example structure.

Referring to FIG. 5, an assembly 10 includes a first deck 12 having a first stack 14 of alternating first and second tiers 16 and 18. The illustrated region of the first stack 14 is only a partial region of the stack, and it is to be understood that the stack may comprise more than the illustrated number of first and second tiers 16 and 18.

The first tiers 16 include first and second conductive materials 20 and 22. The first and second conductive materials 20 and 22 have different compositions relative to one another. In some embodiments, the first and second conductive materials 20 and 22 may be metal-containing materials. The first conductive material 20 may consist of, or consist essentially of, one or more metals (e.g., one or more of titanium, tungsten, cobalt, nickel, platinum, ruthenium, etc.). The second conductive material may comprise, consist essentially of, or consist of one or more metal-containing compositions (e.g., one or more of metal germanide, metal silicide, metal nitride, metal carbide, metal boride, etc.). In some embodiments, the first conductive material 20 may consist of, or consist essentially of, tungsten (W); and the second conductive material 22 may comprise, consist essentially of, or consist of one or more of titanium nitride (TiN), tungsten nitride (WN), and tantalum nitride (TaN), where the chemical formulas indicate primary constituents rather than specific stoichiometries.

In some embodiments, the second conductive material 22 may be considered to be configured as horizontally-extending bars 24 within the first tiers 16.

The second tiers 18 comprise an insulative material 26. The insulative material 26 may comprise any suitable composition(s); and in some embodiments may comprise, consist essentially of, or consist of silicon dioxide. The silicon dioxide may have a dielectric constant of about 3.9, and accordingly may be of ordinary density associated with relatively high-quality silicon dioxide.

In some embodiments, the materials 20 and 26 may be referred to as first and second materials, respectively; with such first and second materials being associated with the first and second tiers 16 and 18, respectively.

In some embodiments, the first tiers 16 may be considered to correspond to conductive levels, and the second tiers 18 may be considered to correspond to insulative levels; with the conductive levels and insulative levels alternating with one another within the first stack 14. In the illustrated embodiment, each of the conductive levels of first tiers 16 comprises two (first and second) conductive materials (20 and 22). In other embodiments, each of the conductive levels may comprise only a single conductive material (e.g., only first conductive material 20) or may comprise more than two conductive materials.

The deck 12 has a conductive region 28 extending entirely through the first stack 14 of the first and second tiers 16 and 18. The first conductive material 20 fills such conductive region 28.

The illustrated first deck 12 may be formed with any suitable processing. In some embodiments, the materials 20, 22 and 26 may be deposited as layers stacked one atop another. Such deposition may comprise, for example, one or more of atomic layer deposition (ALD), chemical vapor deposition (CVD) and physical vapor deposition (PVD). Subsequently, an opening may be formed through the layers and filled with the first conductive material 20 to form the illustrated conductive region 28 passing through the first deck 12.

The first deck 12 may be supported by a semiconductor substrate (base). The semiconductor substrate is not shown in the figures of this disclosure in order to simplify the drawings. The semiconductor substrate may comprise any suitable semiconductor composition(s); and in some embodiments may comprise monocrystalline silicon.

Figure 6:
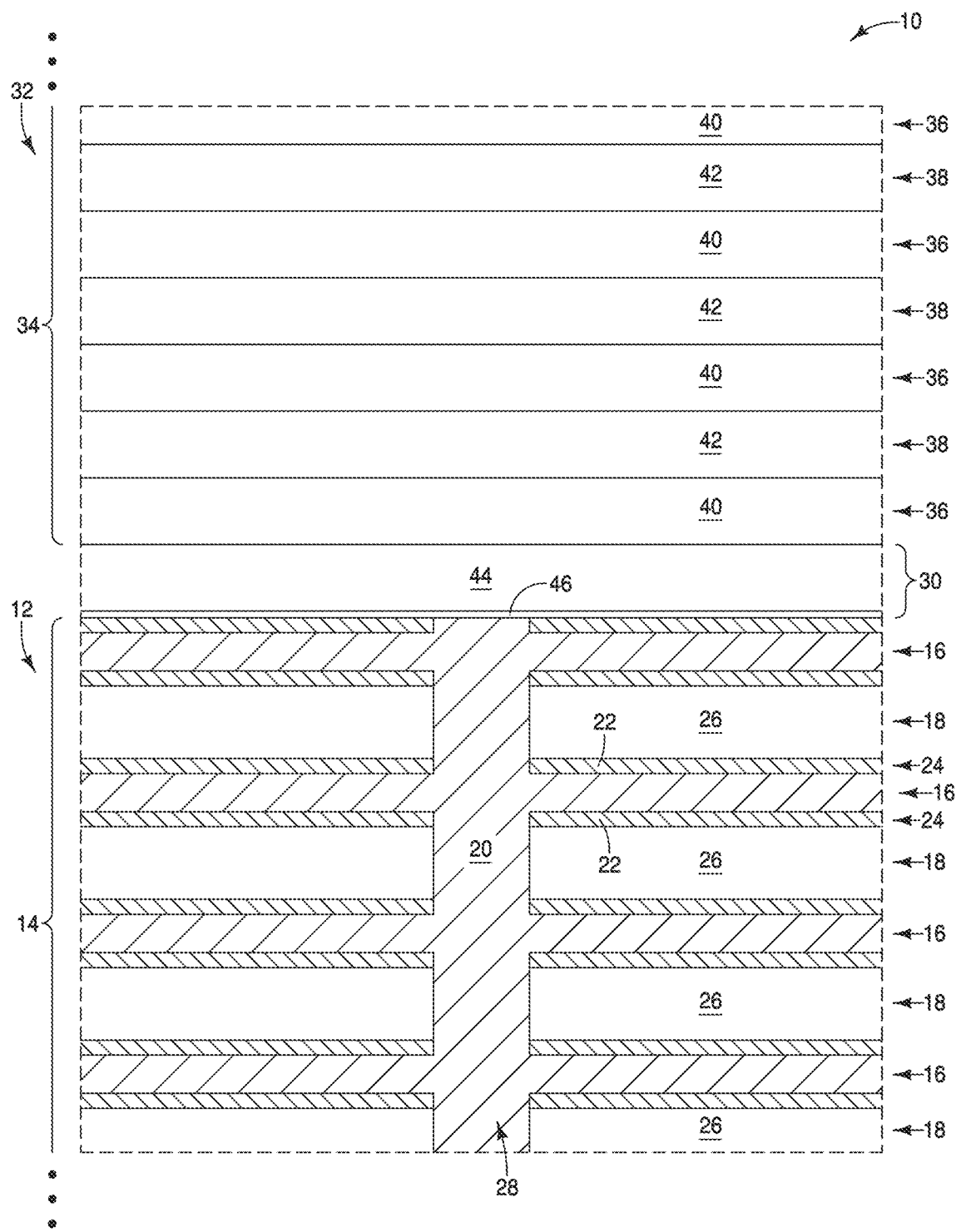

Referring to FIG. 6, an inter-deck structure 30 is formed over the first deck (lower deck) 12, and a second deck (upper deck) 32 is formed over the inter-deck structure.

The second deck 32 comprises a second stack 34 of alternating third and fourth tiers 36 and 38. The illustrated region of the second stack 34 is only a partial region of the stack, and it is to be understood that the stack may comprise more than the illustrated number of third and fourth tiers 36 and 38.

The third and fourth tiers 36 and 38 comprise third and fourth materials 40 and 42, respectively. The third and fourth materials are different compositions relative to one another.

The fourth material 42 is an insulative material, and in some embodiments may comprise the same composition as the insulative material 26 of the first stack 14. Accordingly, in some embodiments the fourth material 42 may comprise silicon dioxide having a dielectric constant of about 3.9.

The third material 40 may be a sacrificial material, and may comprise any suitable composition(s). In some embodiments, the third material 40 may comprise, consist essentially of, or consist of silicon nitride (SiN), where the chemical formula indicates primary constituents rather than a specific stoichiometry.

The inter-deck structure 30 comprises a first inter-deck material 44 over a second inter-deck material 46.

In some embodiments, the first inter-deck material 44 may be a relatively "soft" material, meaning that the first inter-deck material 44 may be relatively easy to selectively etch relative to the third and fourth materials 40 and 42 of the second stack 34. The first inter-deck material 44 may comprise, for example, silicon dioxide, which etches faster than the silicon dioxide of fourth material 42 when exposed to a hydrofluoric-acid-containing etchant. In some embodiments, the first inter-deck material 44 may comprise silicon dioxide having a lower density than the silicon dioxide of fourth material 42 (e.g., the first inter-deck material 44 may be porous silicon dioxide). Additionally, or alternatively, one or more dopants may be provided within the silicon dioxide of the first inter-deck material 44 to increase an etch rate of such silicon dioxide. Suitable dopants may include, for example, one or more of carbon, boron and phosphorus.

The second inter-deck material 46 may be a relatively "hard" material, meaning that the second inter-deck material 46 may function as an etch-stop for an etch utilized to punch through the third and fourth materials 40 and 42 of the second stack 34. In some embodiments, the second inter-deck material 46 may comprise, consist essentially of, or consist of aluminum oxide (AlO), where the chemical formula indicates primary constituents rather than a specific stoichiometry.

Figure 7:
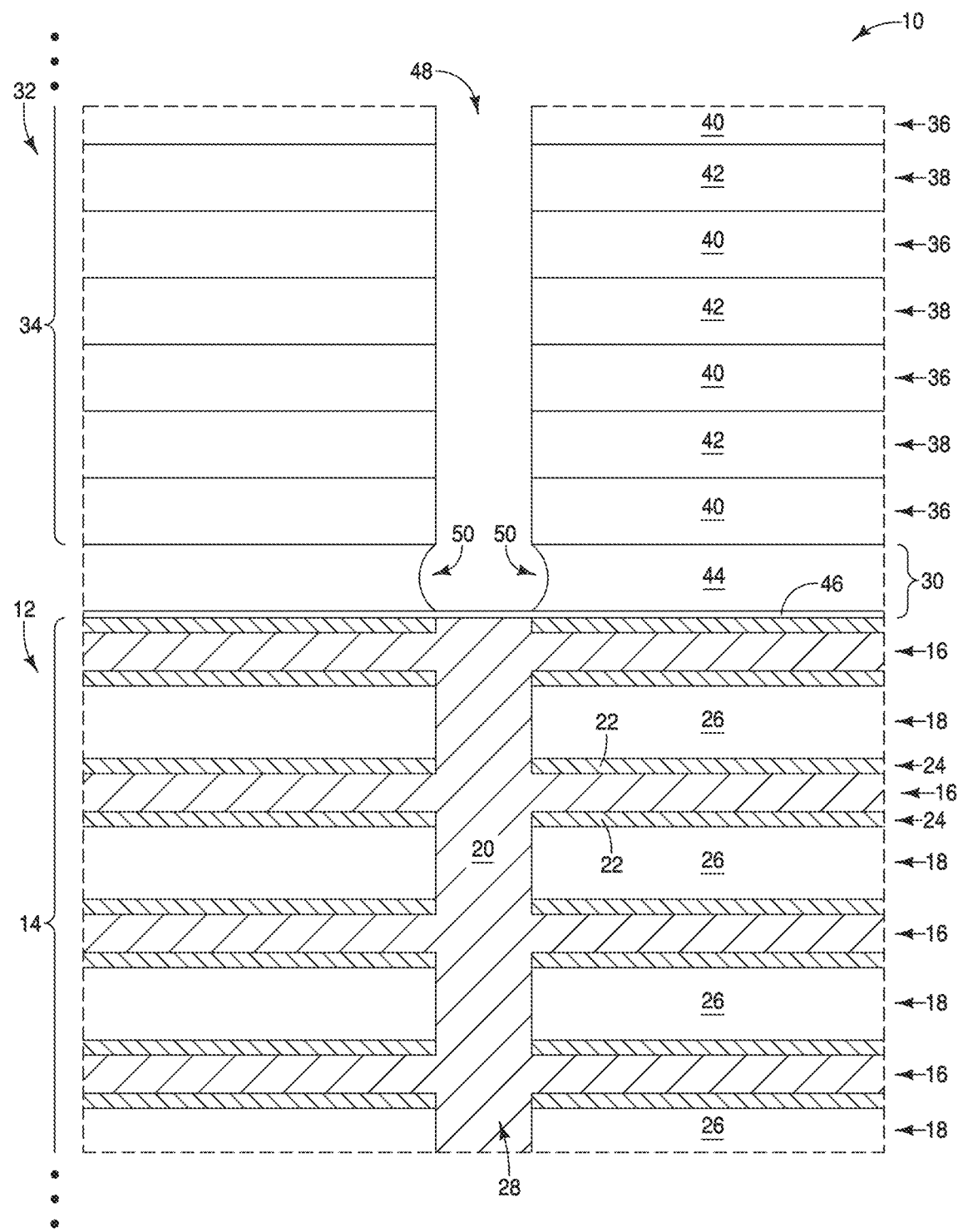

Referring to FIG. 7, an opening 48 is formed through the second stack 34, and through the first inter-deck material 44. The opening 48 stops on the second inter-deck material 46 (i.e., the etch-stop material).

The opening 48 may be patterned with any suitable methodology. For instance, in some embodiments a photolithographically patterned photoresist mask (not shown) may be utilized to define a location of the opening 48, and the opening 48 may then be formed with one or more suitable etches. The etches utilized to form the opening 48 may utilize hydrofluoric acid to penetrate silicon dioxide (fourth material 42) of levels (fourth tiers) 38, and phosphoric acid to penetrate silicon nitride (third material 40) of levels (third tiers) 36. The hydrofluoric acid can also be utilized to penetrate silicon dioxide of the first inter-deck material 44.

In the illustrated embodiment, the first inter-deck material 44 is recessed to form cavities 50, which extend under the second deck 32. Such recessing may be due to the first inter-deck material 44 being "softer" (i.e., more readily etched) than the materials of the second stack 34.

Figure 8:
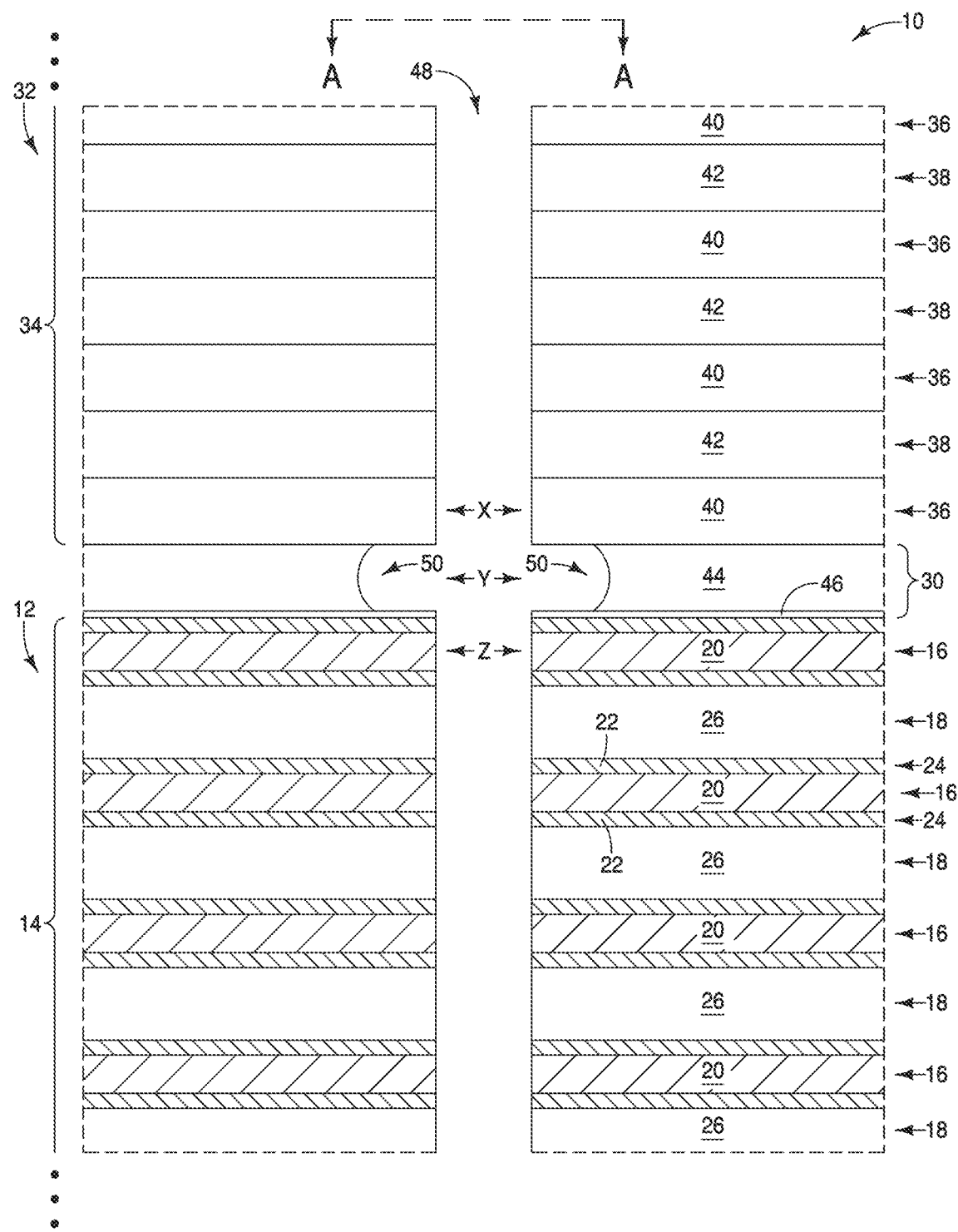

Referring to FIG. 8, the opening 48 is extended through the second inter-deck material 46 to the conductive region 28 (FIG. 7) comprising the first conductive material 20, and is then etched through the first conductive material 20. Accordingly, the opening 48 is formed to extend through the first and second decks 12 and 32, and through the inter-deck structure 30 between the first and second decks.

In embodiments in which the second inter-deck material 46 comprises aluminum oxide, the opening 48 may be extended through such second inter-deck material with an etch utilizing phosphoric acid.

In some embodiments, it can be advantageous to utilize tungsten within the conductive region 28 of FIG. 7 as tungsten may be readily removed selectively relative to the silicon-oxide-containing materials 26 and 40, and the silicon-nitride-containing fourth material 42 (such may be accomplished with, for example, an etch utilizing nitric acid (HNO₃)). The opening 48 has relatively straight vertical sidewalls passing through the first and second decks 12 and 32, rather than having tapered sidewalls. Such may be advantageous relative to architectures formed with conventional processing, in that such architectures frequently have tapered sidewalls of openings analogous to the opening 48, which can lead to problems in subsequently forming materials within such openings.

In the shown embodiment, the cavities 50 are extended under the second deck 32 as the opening 48 is passed through the second inter-deck material 46 and through the first stack 14. In some embodiments, the first inter-deck material 44 may be considered to be removed from lateral regions of the inter-deck structure 30 adjacent the opening of conductive region 28 to extend the cavities laterally under the second deck 32. The removal of the first inter-deck material 44 to extend the cavities 50 may occur during the etching utilized to pass through the second inter-deck material 46 and/or during the etch utilized to remove first conductive material 20 from the conductive region 28.

Figure 8A:
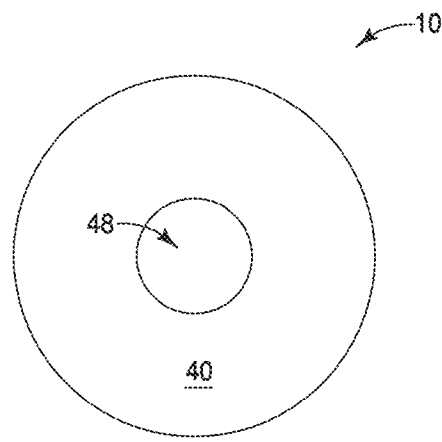
FIG. 8A is a diagrammatic top-down view of a region of the integrated assembly of FIG. 8, along the line A-A of FIG. 8.

FIG. 8A shows a top-down view along the line A-A of FIG. 8, and shows that the opening 48 has a closed-shaped when viewed from above. In the illustrated embodiment, the opening 48 is circular when viewed from above. In other embodiments, the opening may have other suitable closed shapes when viewed from above (e.g., elliptical, rectangular, etc.).

Figure 8B:
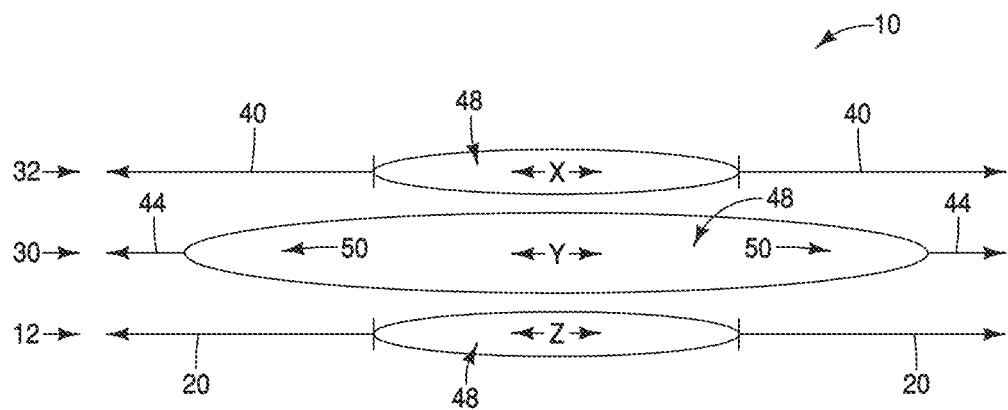
FIG. 8B is a diagrammatic three-dimensional view of vertically-offset regions of the integrated assembly of FIG. 8.

FIG. 8B diagrammatically illustrates regions of the opening 48 passing through materials 40, 44 and 20 at regions labeled X, Y and Z in FIG. 8. The region Z is within the first deck 12, the region X is within the second deck 32, and the region Y is within the inter-deck structure 30. The view of FIG. 8B further illustrates that the cavities 50 extend into regions between the first and second decks 12 and 32.

The opening 48 may be representative of a large plurality of substantially identical openings formed through the first and second decks 12 and 32 at the processing stage of FIG. 8; with the term "substantially identical" meaning identical to within reasonable tolerances of fabrication and measurement.

Figure 9:
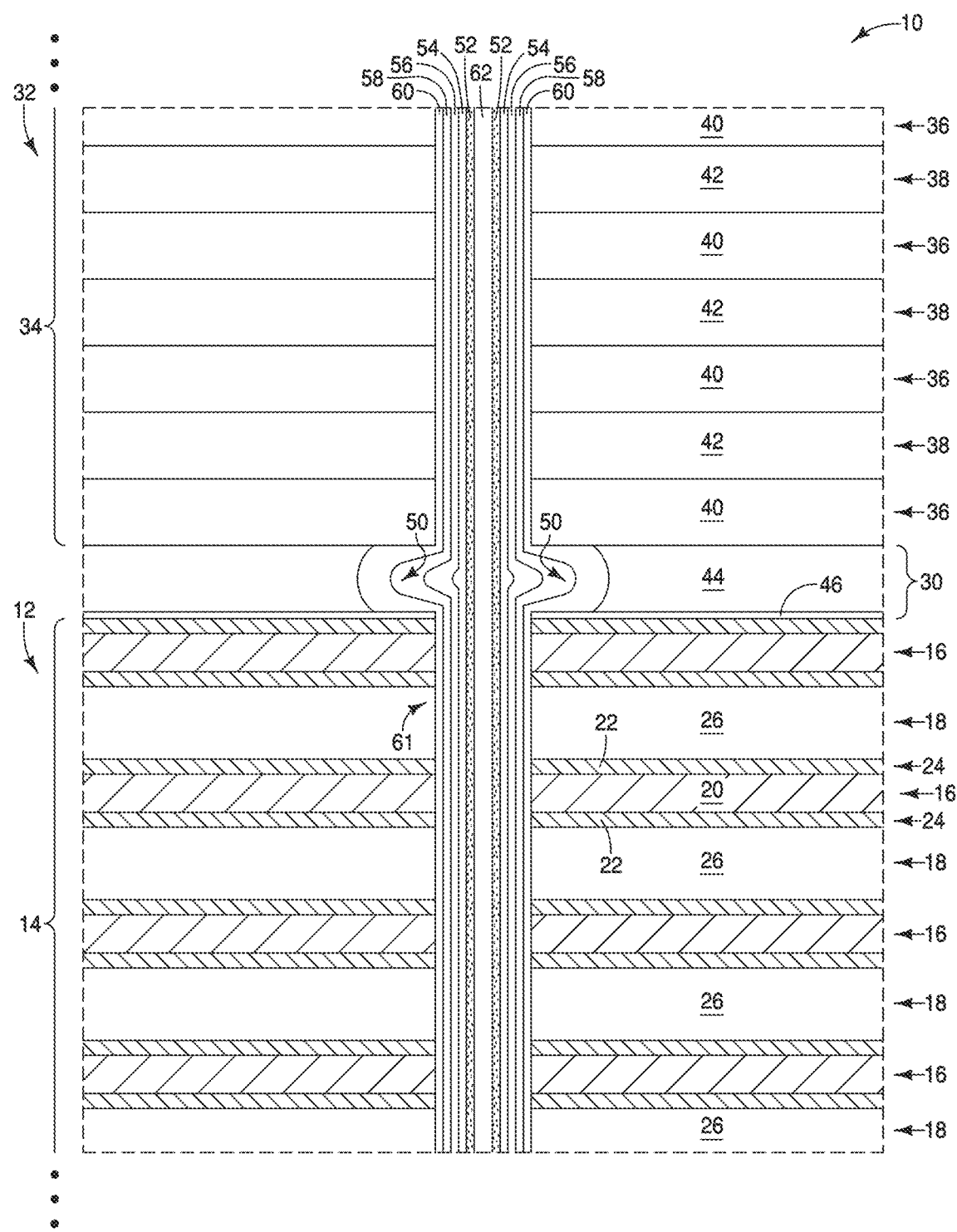
FIGS. 9 and 10 are diagrammatic cross-sectional side views of the region of the example integrated assembly of FIG. 5 at example sequential process stages following process stage of FIG. 8. The process stage of FIG. 10 shows a region of an example multi-deck memory device.

Referring to FIG. 9, dielectric-barrier material 60 is formed within the opening 48, charge-blocking material 58 is formed laterally adjacent the dielectric-barrier material 60, charge-storage material 56 is formed laterally adjacent the charge-blocking material 58, tunneling material (dielectric material, gate-dielectric material) 54 is formed laterally adjacent the charge-storage material 56, and channel material 52 is formed laterally adjacent the tunneling material 54. The memory cell materials 52, 54, 56, 58 and 60 may be referred to as memory cell materials.

The channel material 52 may comprise any suitable composition(s); and in some embodiments may comprise, consist essentially of, or consist of one or more of silicon, germanium, III/V semiconductor material (e.g., gallium phosphide), semiconductor oxide, etc., with the term "III/V semiconductor material" referring to semiconductor materials comprising elements selected from groups III and V of the periodic table (with groups III and V being old nomenclature, and now being referred to as groups 13 and 15). In some example embodiments, the channel material 52 may comprise, consist essentially of, or consist of appropriately doped silicon.

In the illustrated embodiment, the channel material is configured as an annular ring surrounding an insulative material 62 (e.g., silicon dioxide). Such configuration of the channel material may be considered to correspond to a "hollow" channel configuration (or as a hollow channel material pillar), with the insulative material 62 being provided within the "hollow" of the channel material configuration. In other embodiments, the channel material may be configured as a solid pillar, rather than being configured as the illustrated hollow pillar.

The tunneling material 54 may comprise any suitable composition(s); and in some embodiments may comprise one or more of silicon dioxide, aluminum oxide, hafnium oxide, zirconium oxide, etc.

The charge-storage material 56 may comprise any suitable composition(s); and in some embodiments may comprise charge-trapping material; such as, for example, one or more of silicon nitride, silicon oxynitride, conductive nanodots, etc.

The charge-blocking material 58 may comprise any suitable composition(s); and in some embodiments may comprise one or more of silicon dioxide, aluminum oxide, hafnium oxide, zirconium oxide, etc.

The dielectric-barrier material 60 may comprise any suitable composition(s); and in some embodiment may comprise one or more of aluminum oxide, hafnium oxide, zirconium oxide, etc.

The memory cell materials 52, 54, 56, 58 and 60 may be considered to be configured as a pillar 61 which passes through the first and second decks 12 and 32. Such pillar may be representative of a plurality of substantially identical pillars that may be formed at the process stage of FIG. 9.

The channel material 52 may be coupled with a conductive source structure (e.g., a source line or source plate) analogous to the source structures described above with reference to FIGS. 1-4. In some embodiments, such source structure may be under the first deck 12. The source structure may be comprised by the first deck 12, or may be within another deck under the first deck 12.

In the illustrated embodiment of FIG. 9, several of the memory cell materials 52, 54, 56, 58 and 60 extend into the cavities 50. Specifically, the dielectric-barrier material 60, the charge-blocking material 58, and the charge-storage material 56 extend into the cavities 50. In other embodiments, additional memory cell materials may extend into the cavities 50, or fewer memory cell materials may extend into the cavities 50.

Figure 10:
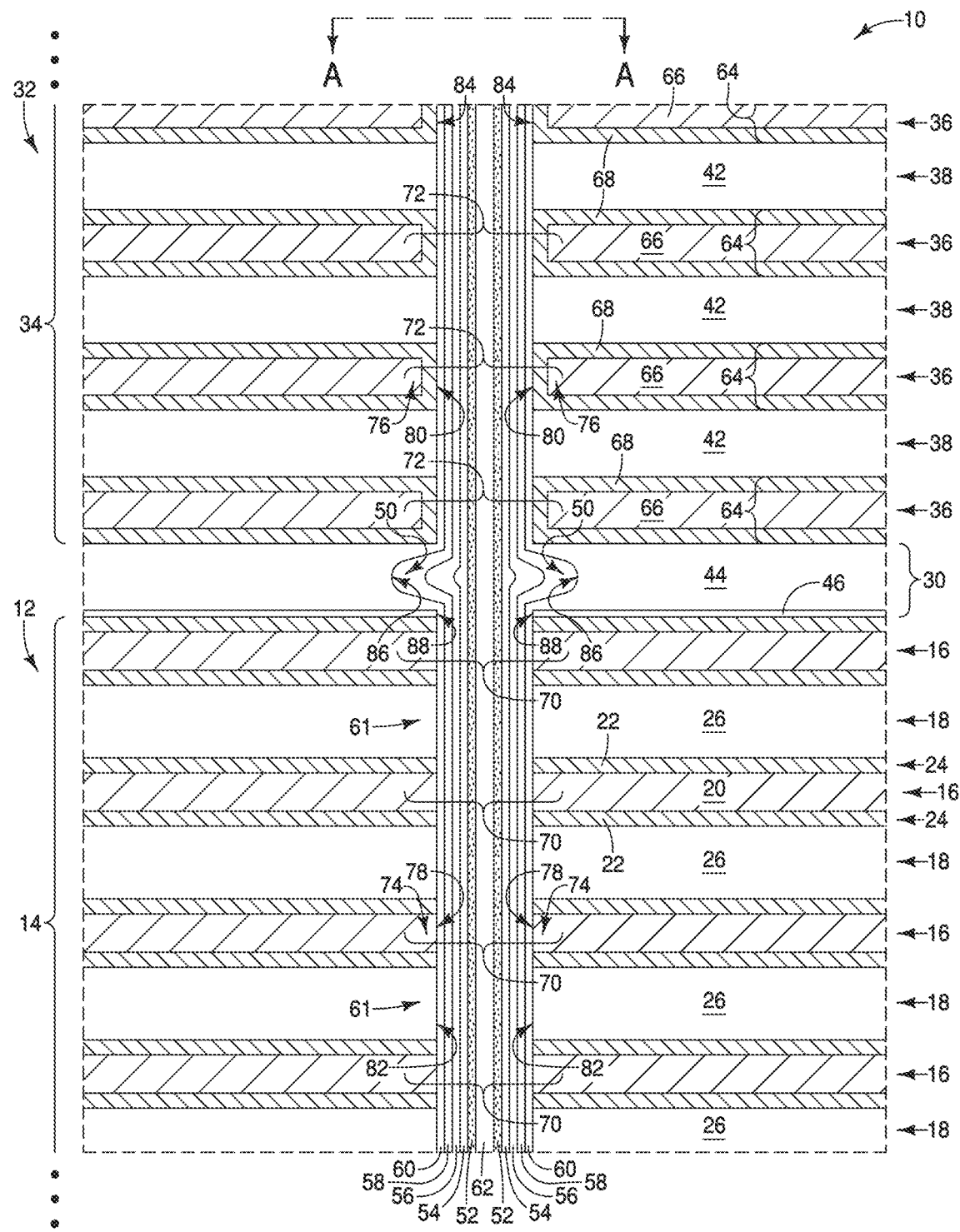

Referring to FIG. 10, the third material 40 (FIG. 9) is removed from the third tiers 36 and replaced with conductive regions 64. The third material 40 may be removed with any suitable processing, and in some embodiments may be removed with an etch utilizing phosphoric acid. The third material may be removed utilizing slits (not shown) provided through the second deck 32 in regions laterally adjacent to the pillars 61 of the memory cell materials 52, 54, 56, 58 and 60.

The conductive regions 64 comprise a fifth material 66, and a sixth material 68 extending along an outer periphery of the fifth material.

In some embodiments, the fifth material 66 may comprise a same composition as the first conductive material 20. For instance, the materials 20 and 66 may both comprise, consist essentially of, or consist of tungsten.

In some embodiments, the sixth material 68 may comprise a same composition as the second conductive material 22. For instance, the materials 22 and 68 may both comprise, consist essentially of, or consist of one or more of titanium nitride, tungsten nitride and tantalum nitride.

The third and fourth tiers 36 and 38 may be referred to as conductive levels and insulative levels, respectively, at the processing stage of FIG. 10; with the conductive levels and insulative levels alternating with one another within the second stack 34 of the upper second deck 32. In the illustrated embodiment, each of the conductive levels (third tiers 36) comprises two conductive materials (66 and 68). In other embodiments, each of the conductive levels may comprise only a single conductive material or may comprise more than two conductive materials.

First memory cells 70 are within the first stack 14 of the first deck 12. The first memory cells include segments of the first and second conductive materials 20 and 22 of the first tiers 16, and also include segments of the memory cell materials 52, 54, 56, 58 and 60.

Second memory cells 72 are within the second stack 34 of the second deck 32. The second memory cells include segments of the conductive materials 66 and 68 of the third tiers 36, and also include segments of the memory cell materials 52, 54, 56, 58 and 60.

The first and second memory cells 70 and 72 may be suitable for utilization in NAND memory arrays (devices, architectures) analogous to the memory arrays described above with reference to FIGS. 1-4. The assembly 10 of FIG. 10 may be considered to be an example configuration of a memory device.

In operation, the charge-storage material 56 may be configured to store information in the first and second memory cells 70 and 72. The value (with the term "value" representing one bit or multiple bits) of information stored in an individual memory cell (70 or 72) may be based on the amount of charge (e.g., the number of electrons) stored in a charge-storage region. The amount of charge within an individual charge-storage region may be controlled (e.g., increased or decreased) at least in part, based on the value of voltage applied to an associated control gate, and/or based on the value of voltage applied to an associated channel material. The tunneling material 54 may be configured to allow desired tunneling (e.g., transportation) of charge (e.g., electrons) between the charge-storage material 56 and the channel material 52. The tunneling material may be configured (i.e., engineered) to achieve a selected criterion, such as, for example, but not limited to, an equivalent oxide thickness (EOT). The EOT quantifies the electrical properties of the tunneling material, (e.g., capacitance) in terms of a representative physical thickness. For example, EOT may be defined as the thickness of a theoretical silicon dioxide layer that would be required to have the same capacitance density as a given dielectric material (e.g., tunneling material 54), ignoring leakage current and reliability considerations. The charge-blocking material 58 may provide a mechanism to block charge from flowing from the charge-storage material to the control gate. The dielectric-barrier material 60 may be utilized to inhibit back-tunneling of electrons from the control gate toward the charge-storage material.

The first memory cells 70 are vertically stacked one atop another within the first deck 12. The number of vertically stacked first memory cells 70 may be any suitable number; and in some embodiments may be 8 memory cells, 16 memory cells, 32 memory cells, 64 memory cells, 128 memory cells, etc. Similarly, the second memory cells 72 are vertically stacked one atop another within the second deck 32, and the number of vertically stacked memory cells 72 may be any suitable number.

In the shown embodiment, the second memory cells 72 are vertically stacked over the first memory cells 70.

The segments of the conductive tiers 16 and 36 utilized within the first and second memory cells 70 and 72, respectively, may be considered to be control gate regions of the memory cells. In some embodiments, the segments of the conductive first tiers 16 utilized within the first memory cells 70 may be referred to as first control gate regions 74, and the segments of the conductive third tiers 36 utilized within the second memory cells 72 may be referred to as second control gate regions 76.

In the illustrated embodiment, the first control gate regions 74 comprise the first conductive material 20 vertically between the horizontally-extending bars 24 of the second conductive material 22. The first control gate regions 74 have terminal edges 78 which are directly against the dielectric-barrier material 60; and such terminal edges comprise both the first conductive material 20 and the second conductive material 22.

The second control gate regions 76 comprise the conductive material 66 (which may be referred to as a third conductive material), and the conductive material 68 (may be referred to as a fourth conductive material) along outer surfaces of the conductive material 66. The second control gate regions have terminal edges 80 which are directly against the dielectric-barrier material 60; and such terminal edges only comprise the sixth conductive material 68.

The second memory cells 72 are similar to the first memory cells 70, but are not identical to the first memory cells due to the differences between the first and second control gate regions 74 and 76.

The configuration of FIG. 10 may be considered to be a multi-deck memory device comprising the vertically stacked first and second memory cells 70 and 72. The illustrated memory cells may be comprised by a NAND string, and such NAND string may be representative of a large number of substantially identical NAND strings formed at the processing stage of FIG. 10 to assemble a NAND architecture analogous to the architectures described above with reference to FIGS. 1-4.

Figure 10A:
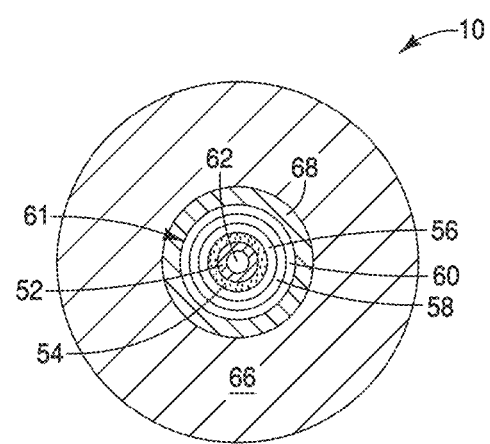
FIG. 10A is a diagrammatic top-down view of a region of the integrated assembly of FIG. 10, along the line A-A of FIG. 10.

FIG. 10A shows a top-down view along the line A-A of FIG. 10, and shows the memory cell materials 52, 54, 56, 58 and 60 arranged as concentric cylinders along the pillar 61.

In some embodiments, the first deck 12 may be considered to comprise first inner lateral edges 82 along sidewalls of the pillar 61, and the second deck 32 may be considered to comprise second inner lateral edges 84 along the sidewalls of the pillar 61. The inter-deck structure 30 may be considered to comprise third inner lateral edges 86, which are laterally offset relative to the first and second lateral edges and which are along the cavities 50. The third lateral edges 86 are associated with the first inter-deck material 44, and specifically correspond to edges where the first inter-deck material 44 interfaces with the dielectric-barrier material 60.

In the shown embodiment, the second inter-deck material 46 may be considered to comprise fourth lateral edges 88. The fourth lateral edges 88 are not substantially laterally offset relative to the first and second inner lateral edges 82 and 84; with the term "substantially" indicating to within reasonable tolerances of fabrication and measurement.

Figure 11:
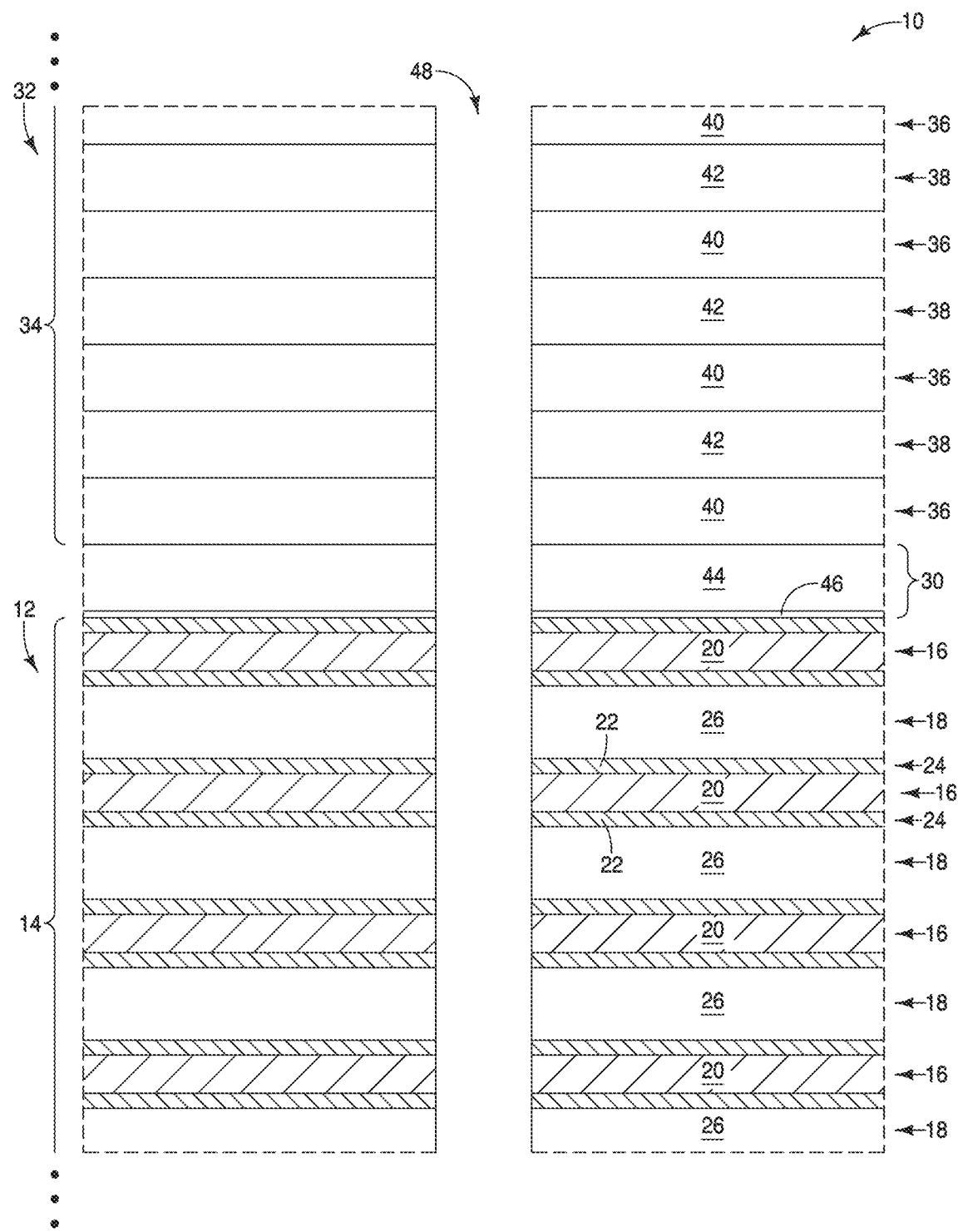
FIGS. 11 and 12 are diagrammatic cross-sectional side views of the example integrated assembly of FIG. 5 at example sequential process stages following the process stage of FIG. 6. The process stage of FIG. 11 may be alternative to that of FIG. 7. The process stage of FIG. 12 shows a region of an example multi-deck memory device.

In some embodiments, the cavities 50 (FIGS. 7 and 8) may be avoided by tailoring the various materials of the inter-deck structure 30 and the etching conditions utilized to form the opening 48. FIG. 11 shows a process stage analogous to that of FIG. 8, but in which the opening 48 has substantially straight vertical sidewalls, rather than comprising the cavities 50.

Figure 12:
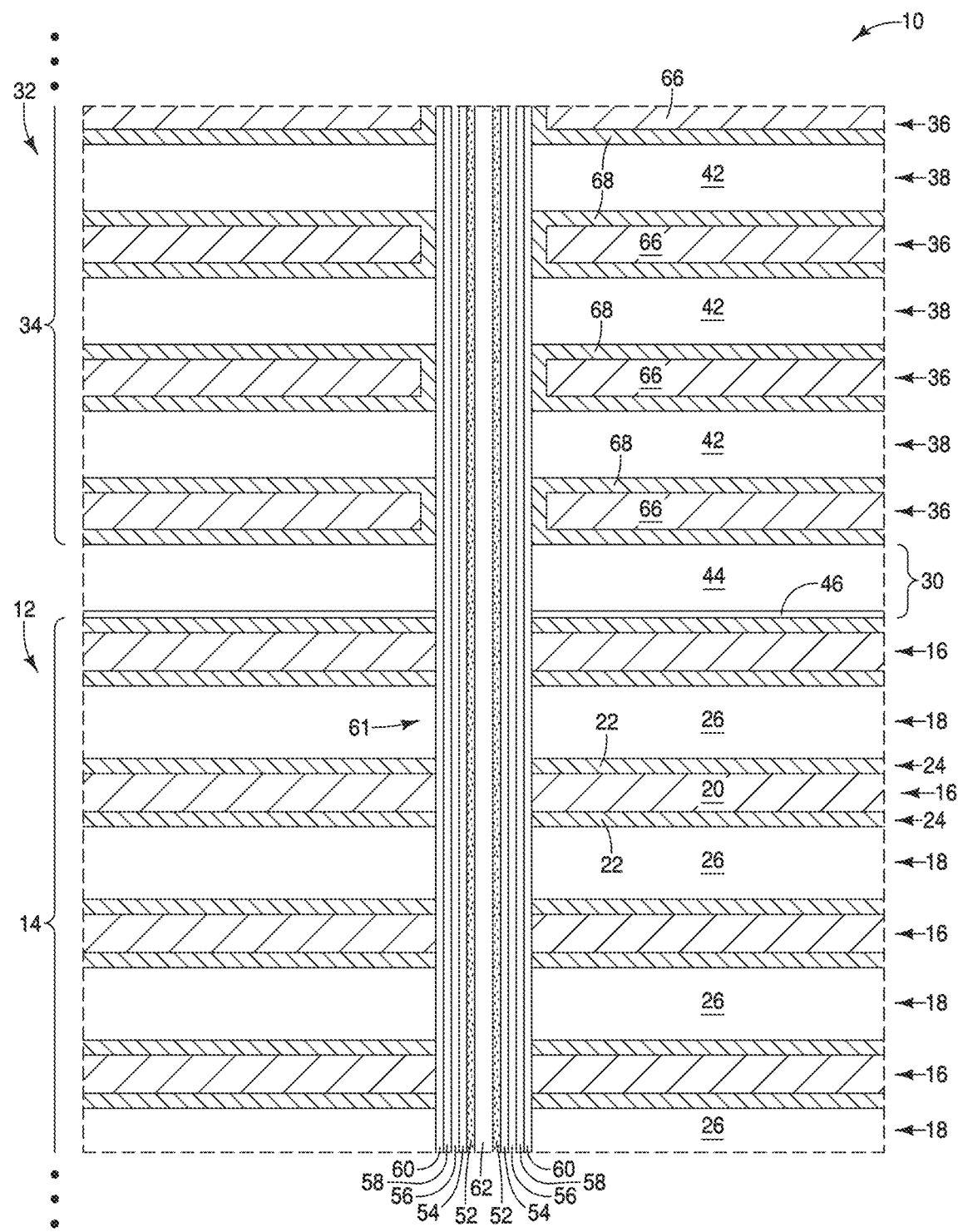

The configuration of FIG. 11 may be subjected to processing analogous to that described above with reference to FIGS. 9 and 10 to form a multi-deck configuration analogous to that described above with reference to FIG. 10. For instance, FIG. 12 shows the assembly 10 as a multi-deck memory device analogous to the multi-deck memory device described above with reference to FIG. 10.

Figure 13:
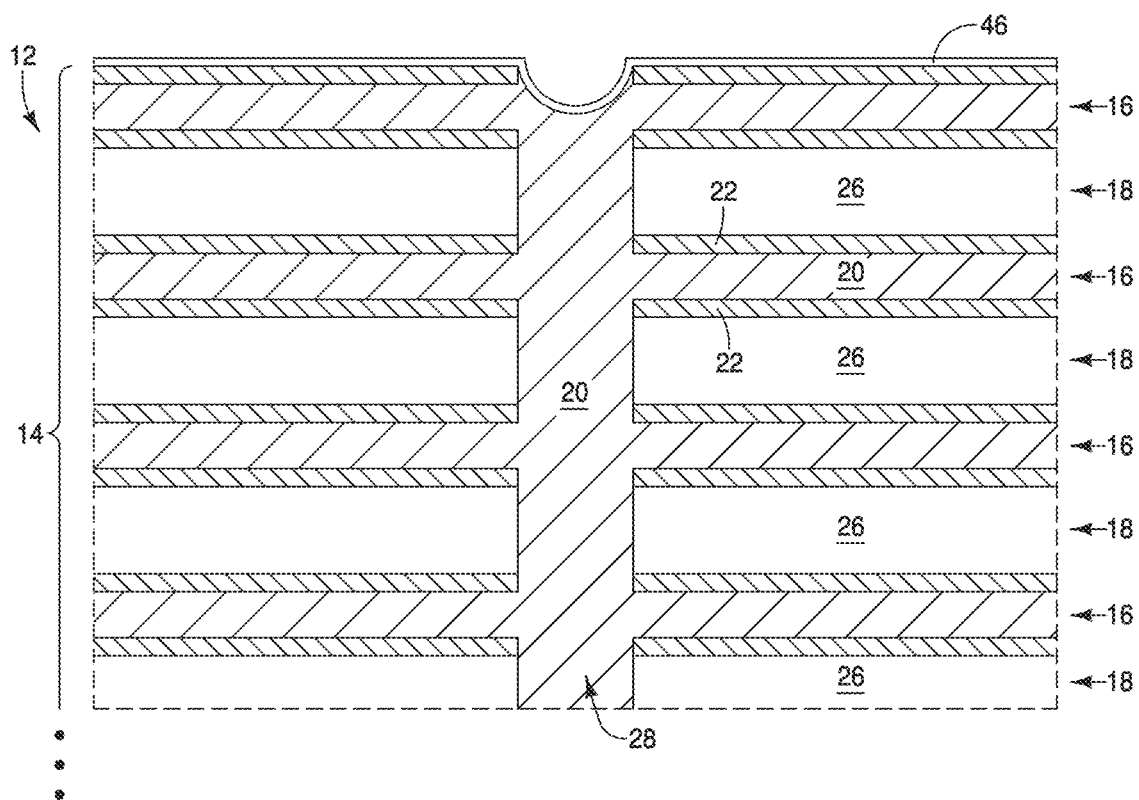
FIGS. 13-17 are diagrammatic cross-sectional side views of a region of an integrated assembly at example process stages of an example method for forming an example structure. The process stage of FIG. 17 shows a region of an example multi-deck memory device.

In some embodiments, the first conductive material 20 of FIG. 5 may be recessed within the conductive region 28 prior to forming the second inter-deck material (etch-stop material) 46. Such may improve subsequent etching through the second inter-deck material (etch stop material) 46 and the first conductive material 20 of conductive region 28. FIG. 13 shows a process stage that may follow the process stage of FIG. 5. The first conductive material 20 is recessed at a top of the conductive region 28, and subsequently the second inter-deck material (etch-stop material) 46 is formed across the upper first tier 16 and across the first conductive material 20 of the conductive region 28.

Figure 14:
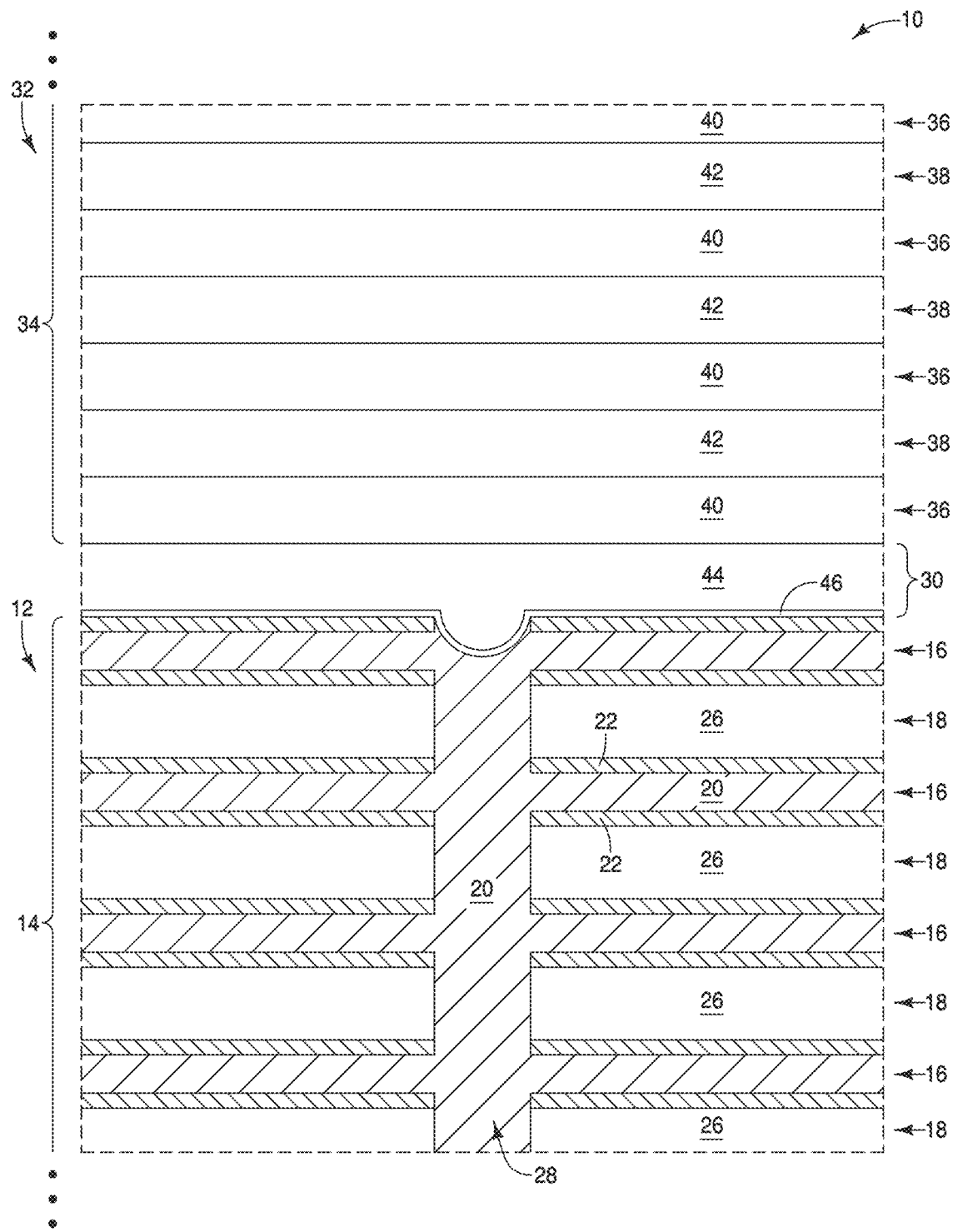

Referring to FIG. 14, the first inter-deck material 44 is formed over the second inter-deck material (etch-stop material) 46 to form the inter-deck structure 30, and then the second deck 32 is formed over the inter-deck structure 30.

Figure 15:
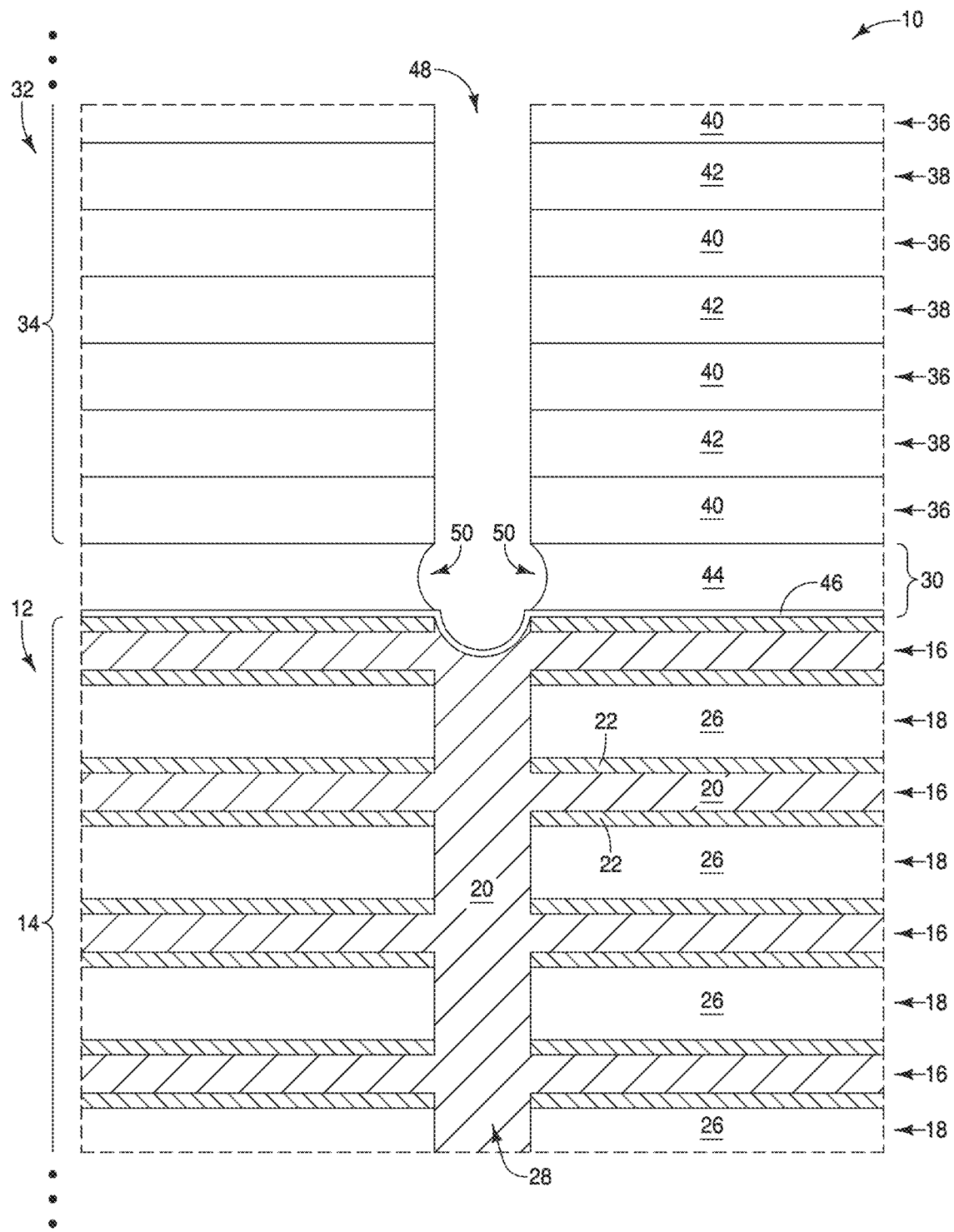

Referring to FIG. 15, the opening 48 is formed to extend through the upper second deck 32, and through the first inter-deck material 44; with the opening 48 stopping on the second inter-deck material (etch-stop material) 46.

Figure 16:
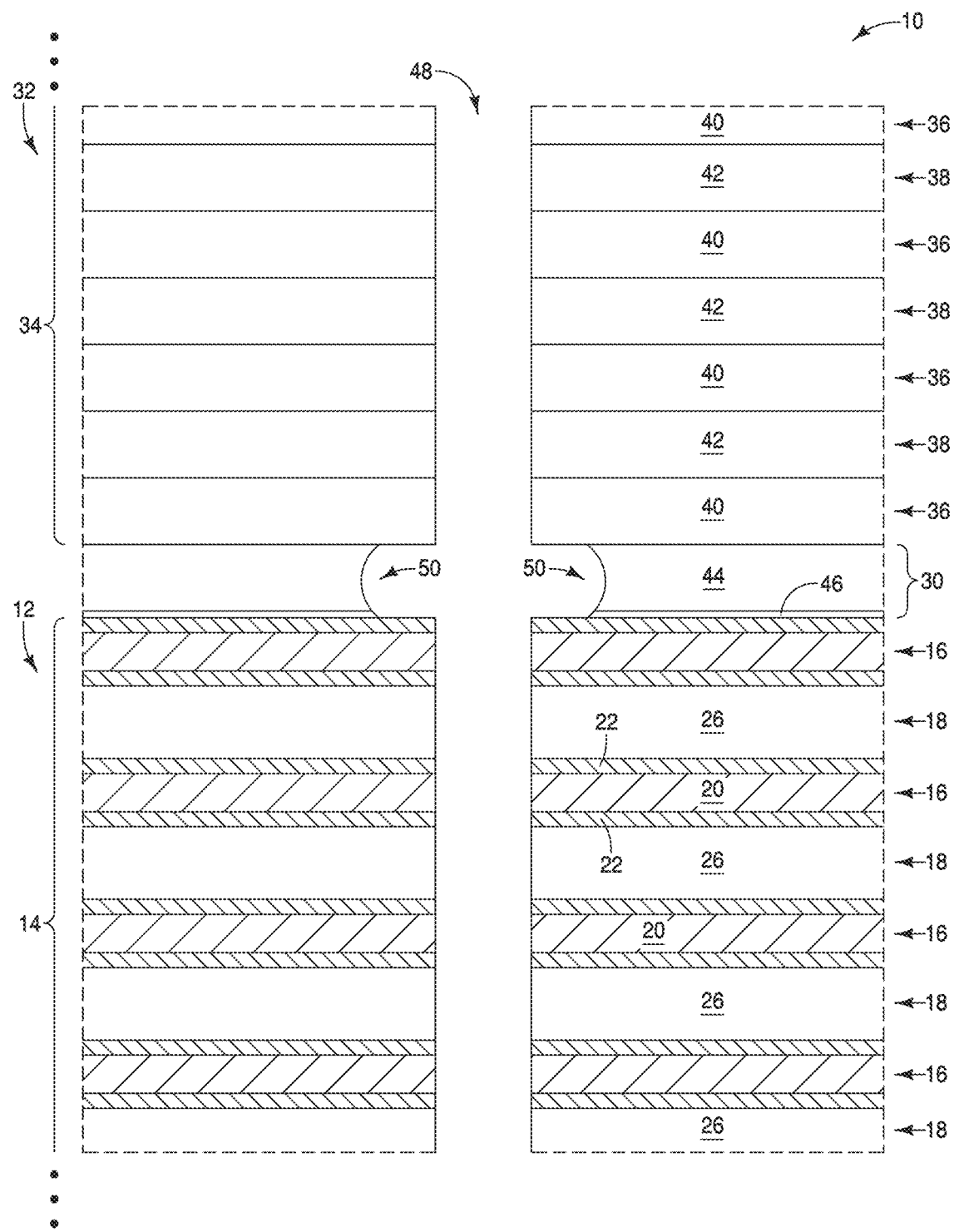

Referring to FIG. 16, the opening 48 is extended through the second inter-deck material (etch-stop material) 46 and through the first conductive material 20 of the conductive region 28 (FIG. 15).

Figure 17:
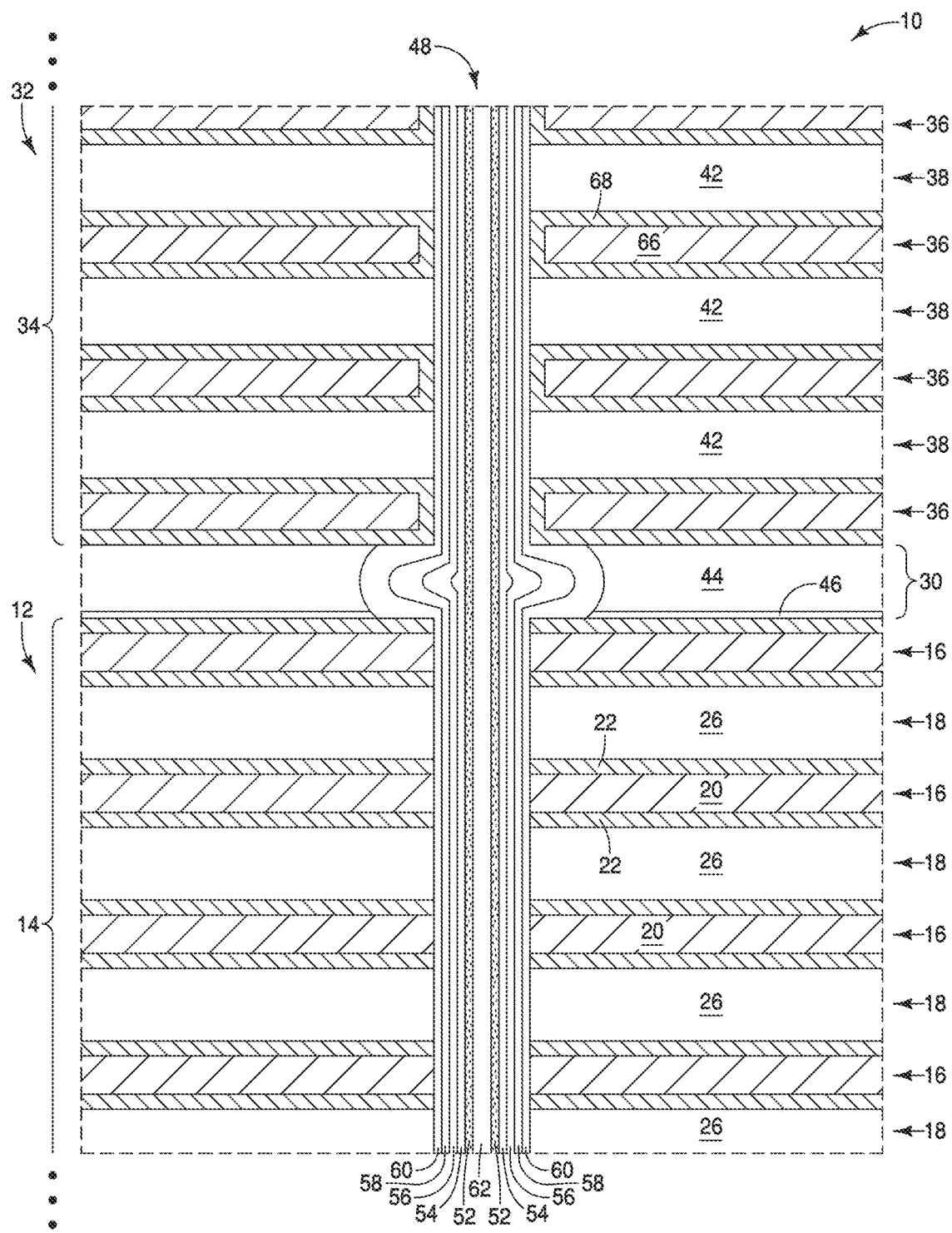

Referring to FIG. 17, the memory cell materials 52, 54, 56, 58 and 60 are provided within the opening 48 to form the pillar 61. Subsequently, the third material 40 (FIG. 16) is replaced with conductive materials 66 and 68 to form a memory device analogous to that described above with reference to FIG. 10.

Figure 18:
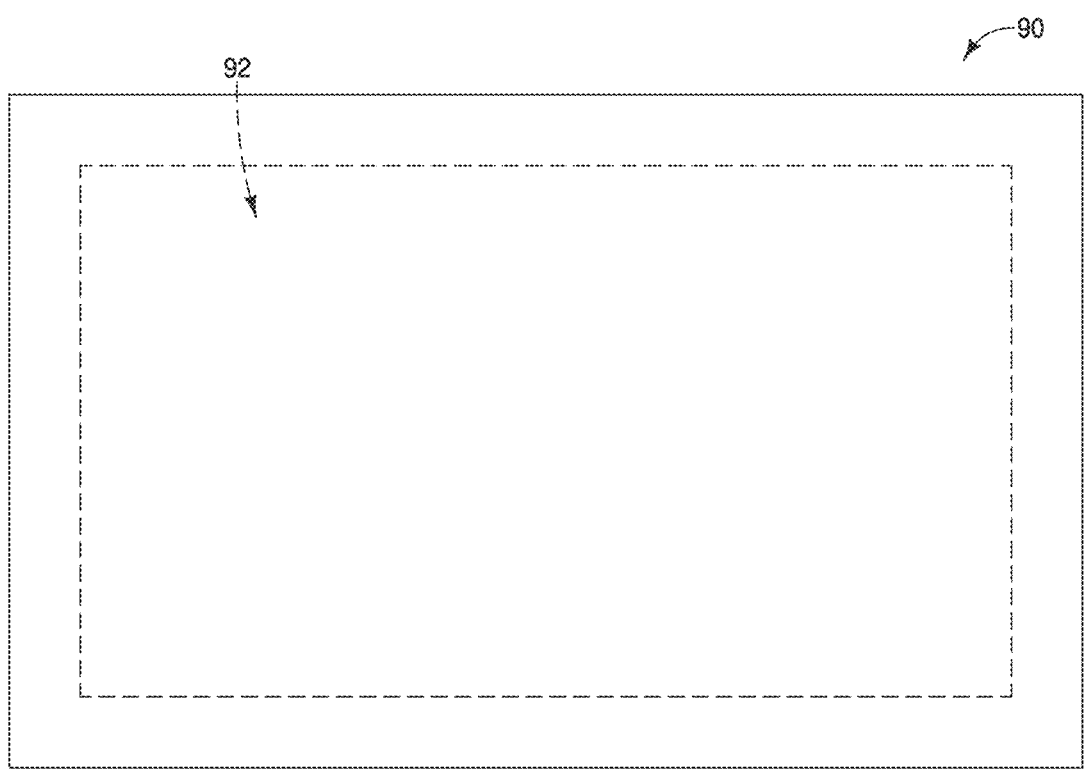
FIG. 18 is a diagrammatic top-down view of an example package.

The memory device configurations of FIGS. 10, 12 and 17 may be incorporated into semiconductor packages. An example semiconductor package 90 as shown in FIG. 18. The semiconductor package 90 may comprise encapsulation material over a semiconductor die 92. The semiconductor die may comprise a memory device configuration formed in accordance with the embodiments described above. The semiconductor die 92 is shown in dashed-line (i.e., phantom) view to indicate that the die may be under other materials. The semiconductor package 90 may include pins, pads, wires, etc. (not shown), for electrically coupling circuitry of the semiconductor die 92 with circuitry external of the semiconductor package 90. Although the semiconductor package 90 is shown comprising only a single die, in other embodiments individual semiconductor packages may comprise multiple dies.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an assembly. A first deck is formed to have a first stack of alternating first and second tiers, and to have a region extending through the first stack. A first material is within the first tiers and is within the region. A second material is within the second tiers. The first material is a conductive material and the second material is an insulative material. An inter-deck structure is formed over the first deck. The inter-deck structure comprises an inter-deck material. A second deck is formed over the inter-deck structure. The second deck has a second stack of alternating third and fourth tiers. The third and fourth tiers comprise third and fourth materials, respectively. The fourth material is an insulative material. An opening is formed to extend through the second stack and the inter-deck structure, and to the region. The first material is removed from the region with an etch selective for the first material relative to the third and fourth materials.

Some embodiments include an integrated assembly with a first deck that has first memory cells arranged in first tiers disposed one atop another. The first deck has first inner lateral edges, A second deck is over the first deck. The second deck has second memory cells arranged in second tiers disposed one atop another. The second deck has second inner lateral edges. An inter-deck structure is between the first and second decks. The inter-deck structure has an inter-deck material with third inner lateral edges which are laterally offset relative to the first and second inner lateral edges to leave cavities between the first and second decks. A pillar passes through the first and second decks and the inter-deck structure. The pillar includes channel material, tunneling material, charge-storage material, charge-blocking material and dielectric-barrier material.

Some embodiments include an integrated assembly having a first deck which has first memory cells arranged in first tiers disposed one atop another. The first memory cells have first control gate regions which include a first conductive material vertically between horizontally-extending bars of a second conductive material. The second conductive material is compositionally different from the first conductive material. The first control gate regions have first terminal edges which comprise both the first conductive material and the second conductive material. An inter-deck structure is over the first deck. A second deck is over the inter-deck structure. The second deck has second memory cells arranged in second tiers disposed one atop another. The second memory cells have second control gate regions which include a third conductive material, and which include a fourth conductive material along an outer surface of the third conductive material. The fourth conductive material is compositionally different from the third conductive material. The second control gate regions have second terminal edges which comprise only the fourth conductive material. A pillar passes through the first and second decks and the inter-deck structure. The pillar includes channel material, tunneling material, charge-storage material, charge-blocking material and dielectric-barrier material; the dielectric barrier material laterally surrounding the channel material, the tunneling material, the charge-storage material and the charge-blocking material. The first and second terminal edges are directly against the dielectric-barrier material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory device, comprising:
    a lower deck including tiers respectively comprising conductive material;
    an upper deck overlying the lower deck and including additional tiers respectively comprising the conductive material;
    an insulative structure interposed between the lower deck and the upper deck; and
    pillar structures respectively comprising semiconductor material continuously extending through each of the upper deck, the insulative structure, and the lower deck, wherein horizontal dimensions of the pillar structures within a vertical span of the insulative structure are greater than additional horizontal dimensions of the pillar structures within vertical spans of the lower deck and the upper deck.

2. The memory device of claim 1, wherein, for respective ones of the pillar structures, a horizontal thickness of the semiconductor material thereof is substantially uniform across substantially an entire vertical height thereof.

3. The memory device of claim 1, wherein the pillar structures respectively further include:
    tunneling dielectric material outwardly horizontally surrounding the semiconductor material;
    charge-storage material outwardly horizontally surrounding the tunneling dielectric material; and
    charge-blocking material outwardly horizontally surrounding the charge-storage material.

4. The memory device of claim 3, wherein each of the tunneling dielectric material, the charge-storage material, and the charge-blocking material continuously extend through each of the upper deck, the insulative structure, and the lower deck.

5. The memory device of claim 3, wherein, for respective ones of the pillar structures, horizontal thicknesses of the tunneling dielectric material, the charge-storage material, and the charge-blocking material within the vertical span of the insulative structure are greater than additional horizontal thicknesses of the tunneling dielectric material, the charge-storage material, and the charge-blocking material within the vertical spans of the lower deck and the upper deck.

6. The memory device of claim 5, wherein:
the horizontal thickness of the charge-storage material within the vertical span of the insulative structure is greater than the horizontal thickness of the tunneling dielectric material within the vertical span of the insulative structure; and
the horizontal thickness of the charge-blocking material within the vertical span of the insulative structure is greater than the horizontal thickness of the charge-storage material within the vertical span of the insulative structure.

7. The memory device of claim 3, wherein, for respective ones of the pillar structures, each of the tunneling dielectric material, the charge-storage material, and the charge-blocking material has an at least partially arcuate vertical profile within the vertical span of the insulative structure.

8. The memory device of claim 1, wherein the additional tiers of the upper deck respectively further comprise conductive liner material horizontally extending from side surfaces of the conductive material to additional side surfaces of the pillar structures.

9. A three-dimensional (3D) NAND memory device, comprising:
a deck including conductive tiers vertically stacked relative to one another and respectively comprising conductive material and conductive liner material substantially covering an upper surface, a lower surface, and at least one side surface of the conductive material; and
an additional deck vertically underlying the deck and including additional conductive tiers respectively comprising additional conductive material;
an interdeck structure comprising insulative material vertically interposed between the deck and the additional deck; and
NAND strings vertically extending through the deck, the interdeck structure, and the additional deck, the NAND strings respectively comprising charge-trap memory cells coupled in series with one another.

10. The 3D NAND memory device of claim 9, wherein the additional conductive tiers of the additional deck respectively further comprise additional conductive liner material substantially covering an additional upper surface and an additional lower surface of the additional conductive material.

11. The 3D NAND memory device of claim 10, wherein the additional conductive liner material of respective ones of the additional conductive tiers of the additional deck has substantially a same material composition as the conductive liner material of respective ones of the conductive tiers of the deck.

12. The 3D NAND memory device of claim 10, wherein, for respective ones of the additional conductive tiers of the additional deck, additional side surfaces of the additional conductive material vertically interposed between the additional upper surface and the additional lower surface are substantially free of the additional conductive liner material.

13. The 3D NAND memory device of claim 9, wherein the interdeck structure further comprises additional insulative material vertically interposed between the insulative material and the additional deck, the additional insulative material having a different material composition than the insulative material.

14. The 3D NAND memory device of claim 9, wherein horizontal boundaries of the interdeck structure proximate respective ones of the NAND strings are outwardly horizontally offset from other horizontal boundaries of each of the deck and the additional deck proximate the respective ones of the NAND strings.

15. The 3D NAND memory device of claim 14, wherein:
the horizontal boundaries of the interdeck structure respectively have an at least partially arcuate vertical profile; and
the other horizontal boundaries of each of the deck and the additional deck respectively have a substantially linear vertical profile.

16. The 3D NAND memory device of claim 9, wherein horizontal boundaries of the interdeck structure proximate respective ones of the NAND strings are substantially horizontally aligned with other horizontal boundaries of each of the deck and the additional deck proximate the respective ones of the NAND strings.

17. A multi-deck memory device, comprising:
a lower deck including tiers respectively comprising a conductive structure and conductive liner structure on an upper surface and a lower surface of the conductive structure;
an upper deck vertically overlying the lower deck and including additional tiers respectively comprising an additional conductive structure and an additional conductive liner structure on an additional upper surface, an additional lower surface, and an additional side surface of the additional conductive structure;
an interdeck structure vertically interposed between the lower deck and the upper deck and comprising insulative material vertically overlying the lower deck and additional insulative material vertically overlying and having a different material composition than the insulative material; and
pillars respectively comprising semiconductor material continuously vertically extending through each of the upper deck, the interdeck structure, and the lower deck.

18. The multi-deck memory device of claim 17, wherein, for respective ones of the pillars, a lower portion thereof is directly adjacent a side surface of the conductive structure of respective ones of the tiers of the lower deck.

19. The multi-deck memory device of claim 18, wherein, for respective ones of the additional tiers of the upper deck, the additional conductive liner structure thereof horizontally extends from the additional conductive structure thereof to an upper portion of the respective ones of the pillars.

20. The multi-deck memory device of claim 17, wherein, for respective ones of the pillars, a portion thereof within a vertical extent of the interdeck structure is relatively horizontally wider than additional portions thereof within vertical extents of the lower deck and the upper deck.

* * * * *